(12) United States Patent
Sato et al.

(10) Patent No.: US 7,791,449 B2
(45) Date of Patent: Sep. 7, 2010

(54) VARISTOR AND LIGHT-EMITTING APPARATUS

(75) Inventors: Hiroyuki Sato, Tokyo (JP); Yo Saito, Tokyo (JP); Hitoshi Tanaka, Tokyo (JP); Makoto Numata, Tokyo (JP); Goro Takeuchi, Tokyo (JP)

(73) Assignee: TDK Corporation, Tokyo (JP)

( * ) Notice: Subject to any disclaimer, the term of this patent is extended or adjusted under 35 U.S.C. 154(b) by 847 days.

(21) Appl. No.: 11/717,098

(22) Filed: Mar. 13, 2007

(65) Prior Publication Data

US 2007/0223170 A1    Sep. 27, 2007

(30) Foreign Application Priority Data

Mar. 27, 2006  (JP)  .............................. 2006-085941

(51) Int. Cl.
   *H01C 7/10*   (2006.01)
(52) U.S. Cl. .......................................... 338/20; 338/21
(58) Field of Classification Search .................... 338/20, 338/21
   See application file for complete search history.

(56) References Cited

U.S. PATENT DOCUMENTS

| | | | | |
|---|---|---|---|---|
| 3,768,058 | A | * | 10/1973 | Harnden, Jr. .................. 338/20 |
| 4,400,683 | A | * | 8/1983 | Eda et al. ....................... 338/21 |
| 5,412,357 | A | * | 5/1995 | Nakamura et al. ........... 333/181 |
| 5,870,273 | A | * | 2/1999 | Sogabe et al. ............. 361/306.3 |
| 6,507,268 | B2 | * | 1/2003 | McLoughlin ................. 338/21 |
| 7,279,724 | B2 | * | 10/2007 | Collins et al. ................ 257/103 |

FOREIGN PATENT DOCUMENTS

| | | |
|---|---|---|
| JP | A-59-005601 | 1/1984 |
| JP | A-60-260104 | 12/1985 |
| JP | A-64-066908 | 3/1989 |
| JP | A-2-302004 | 12/1990 |
| JP | A-05-299209 | 11/1993 |
| JP | A-2001-015815 | 1/2001 |
| JP | A 2002-246207 | 8/2002 |
| JP | A-2005-244220 | 9/2005 |
| JP | A-2005-340301 | 12/2005 |

OTHER PUBLICATIONS

Notice of Reasons for Rejection for Japanese Patent Application No. 2006-085941 issued Jul. 7, 2009.
Chinese Office Action dated Jun. 26, 2009.

* cited by examiner

*Primary Examiner*—Kyung Lee
(74) *Attorney, Agent, or Firm*—Oliff & Berridge, PLC

(57) ABSTRACT

A varistor comprises an element body, two external electrodes, and a metal conductor. The element body includes a portion having first and second faces opposing each other. Two external electrodes are arranged on the first face of the element body. The metal conductor is arranged on the second face of the element body. The metal conductor has a thermal conductivity higher than that of the element body. At least a region between the two external electrodes and metal conductor in the element body exhibits a nonlinear current-voltage characteristic. The heat transmitted to the varistor is efficiently diffused from the metal conductor in the varistor.

14 Claims, 8 Drawing Sheets

VARISTOR AND LIGHT-EMITTING APPARATUS

BACKGROUND OF THE INVENTION

1. Field of the Invention

The present invention relates to a varistor and a light-emitting apparatus comprising the varistor.

2. Related Background Art

Known as a varistor is one comprising an element body having a varistor layer exhibiting a nonlinear current-voltage characteristic and a pair of internal electrodes disposed so as to interpose the varistor layer between them, and a pair of terminal electrodes formed on an outer surface of the element body and respectively connected to their corresponding internal electrodes (see, for example, Japanese Patent Application Laid-Open No. 2002-246207).

SUMMARY OF THE INVENTION

Meanwhile, varistors can protect electronic devices such as semiconductor light-emitting devices and FET (Field Effect Transistor) against ESD (Electrostatic Discharge) surges when connected in parallel to the electronic devices. The electronic devices include those which generate heat during their operation. When the electronic devices attain a high temperature, they deteriorate their own characteristics, thereby affecting their operation. This makes it necessary to diffuse the generated heat efficiently.

Therefore, it is an object of the present invention to provide a varistor and a light-emitting apparatus which can efficiently diffuse heat.

In one aspect, the present invention provides a varistor comprising an element body including a portion having first and second faces opposing each other; two external electrodes arranged on the first face of the element body; and a metal conductor, arranged on the second face of the element body, having a thermal conductivity higher than that of the element body; wherein at least a region between the two external electrodes and metal conductor in the element body exhibits a nonlinear current-voltage characteristic.

Since a metal conductor having a high thermal conductivity is arranged on the second face of the element body opposing the first face arranged with two external electrodes, the heat transmitted to the varistor can efficiently be diffused from the metal conductor in the varistor in accordance with the present invention. Since the region between the two external electrodes and metal region exhibits a nonlinear current-voltage characteristic, the varistor in accordance with the present invention functions as two varistor components connected in series between the two external electrodes.

Preferably, the metal conductor has a first surface in contact with the second face of the element body, a second surface opposing the first surface, and a third surface extending so as to connect the first and second surfaces to each other; whereas the element body further comprises a portion formed so as to be continuous with the portion having the first and second faces of the element body and be in contact with the third surface of the metal conductor. In this case, the element body can hold the metal conductor, whereby the first surface of the metal conductor and the second face of the element body can be prevented from peeling off from each other.

Preferably, the element body further comprises a portion formed such as to be continuous with the portion formed in contact with the third surface of the metal conductor and be in contact with the second surface of the metal conductor. In this case, the element body can hold the metal conductor more reliably, whereby the first surface of the metal conductor and the second face of the element body can be prevented from peeling off from each other.

In another aspect, the present invention provides a varistor comprising an element body; a metal conductor, arranged within the element body, having a thermal conductivity higher than that of the element body; and two external electrodes arranged on an outer surface of the element body so as to oppose the metal conductor; wherein at least a region between the two external electrodes and metal conductor in the element body exhibits a nonlinear current-voltage characteristic.

Since a metal conductor having a high thermal conductivity is arranged within the element body so as to oppose two external electrodes, the heat transmitted to the varistor in accordance with the present invention can efficiently be diffused from the metal conductor. Since the region between the two external electrodes and metal region exhibits a nonlinear current-voltage characteristic, the varistor in accordance with the present invention functions as two varistor components connected in series between the two external electrodes.

Preferably, in a cross section, perpendicular to an opposing direction of the metal conductor and two external electrodes, passing the metal conductor, the metal conductor has an area ratio of at least 20% but not more than 99.7%, where the total area of the metal conductor and element body is 100%. When the area ratio is thus at least 20%, heat can efficiently be diffused from the metal conductor. When the area ratio is not more than 99.7%, the element body can reliably hold the metal conductor, whereby the first surface of the metal conductor and the second face of the element body can be prevented from peeling off from each other.

Preferably, a thickness between the two external electrodes and metal conductor in the element body is at least 10 μm but not more than 200 μm. When the thickness is thus at least 10 μm, the strength of the element body can be secured. When the thickness is not more than 200 μm, the distance from the two external electrodes to the metal conductor can be reduced, so as to improve the thermal conduction rate therebetween. Therefore, heat can be diffused more efficiently from the metal conductor.

Preferably, a thickness of the metal conductor in the opposing direction of the metal conductor and two external electrodes is at least a thickness between the two external electrodes and metal conductor in the element body. Such a structure can diffuse heat more efficiently from the metal conductor.

Preferably, the metal conductor has a volume ratio of at least 10% but not more than 99.7%, where the total volume of the element body and metal conductor is 100%. Such a structure can diffuse heat more efficiently from the metal conductor.

In still another aspect, the present invention provides a light-emitting apparatus comprising the above-mentioned varistor, and a semiconductor light-emitting device connected physically and electrically to the two external electrodes so as to be connected in parallel to the varistor.

Since the two external electrodes of the varistor are connected physically to the semiconductor light-emitting device, the heat generated in the semiconductor light-emitting device is transmitted to the varistor through the two external electrodes in the light-emitting apparatus in accordance with the present invention. Since the metal conductor having a high thermal conductivity is arranged on the second face of the element body opposing the first face arranged with two external electrodes, the heat transmitted to the varistor can efficiently be diffused from the metal conductor.

The present invention can provide a varistor and a light-emitting apparatus which can efficiently diffuse heat.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Preferred embodiments of the present invention will be described below in detail with reference to the accompanying drawings. In the description the same elements or elements with the same functionality will be denoted by the same reference symbols, without redundant description.

Figure 1:
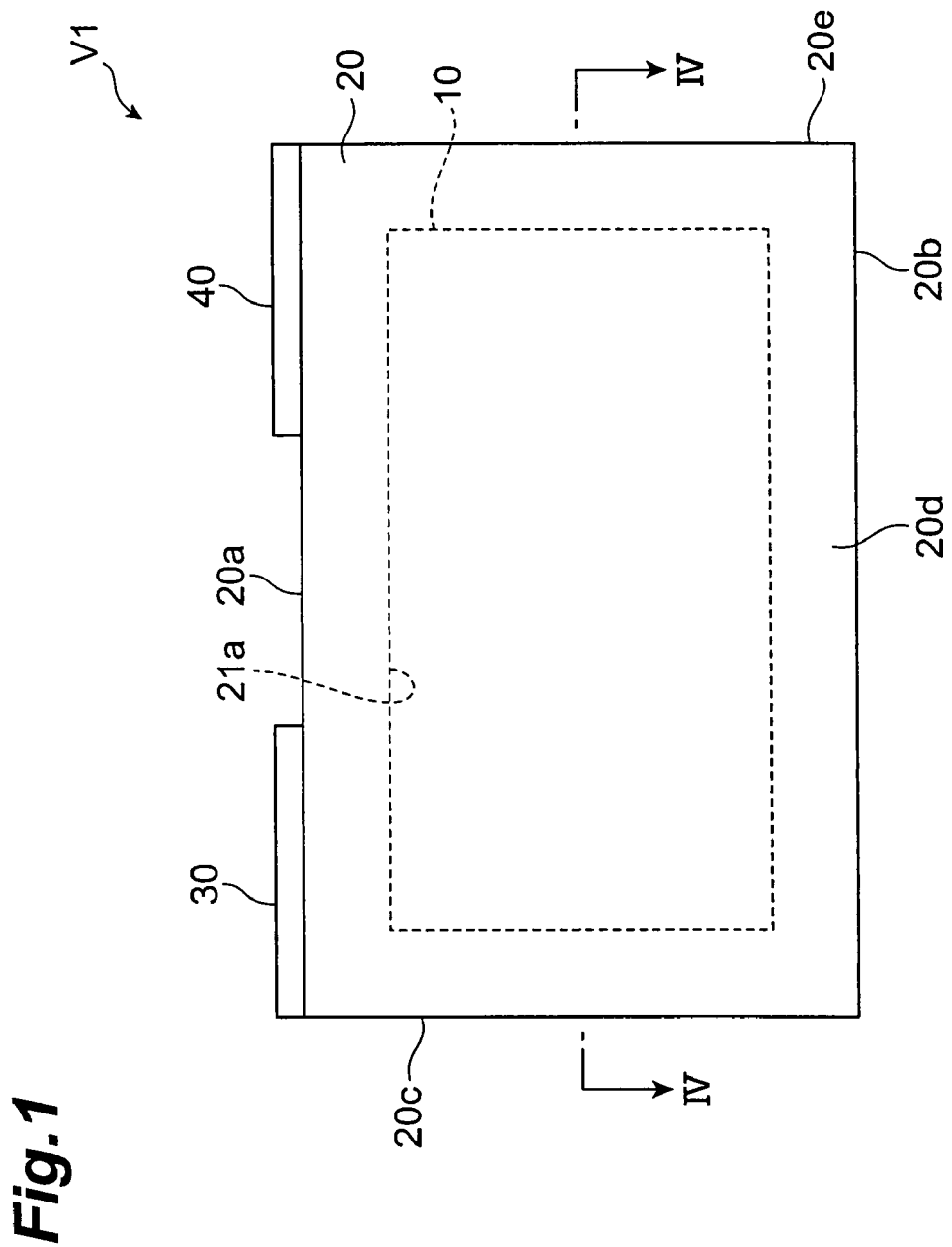
FIG. 1 is a schematic front view showing the varistor in accordance with an embodiment.
Figure 2:
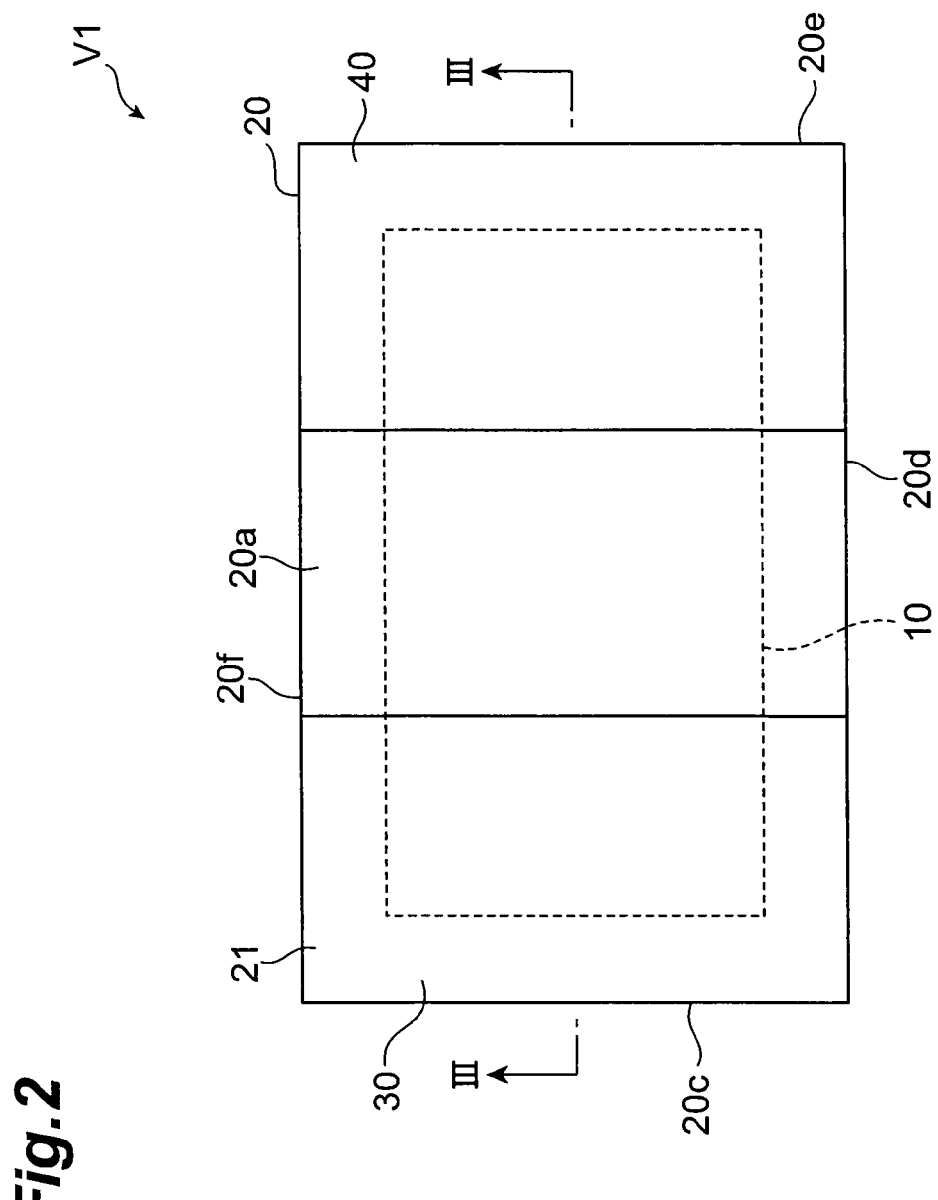
FIG. 2 is a schematic plan view showing the varistor in accordance with the embodiment.
Figure 3:
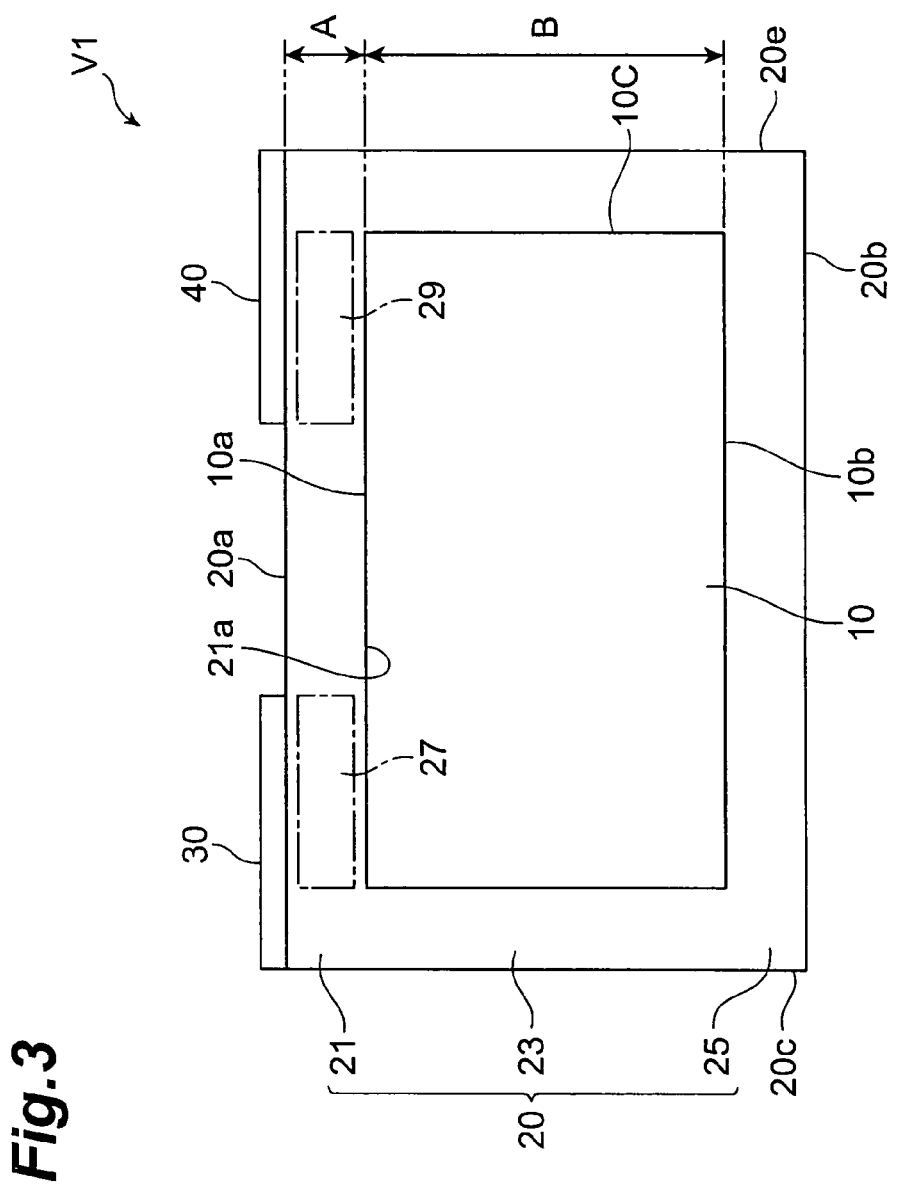
FIG. 3 is a schematic view showing a cross-sectional structure taken along the line III-III of FIG. 2.
Figure 4:
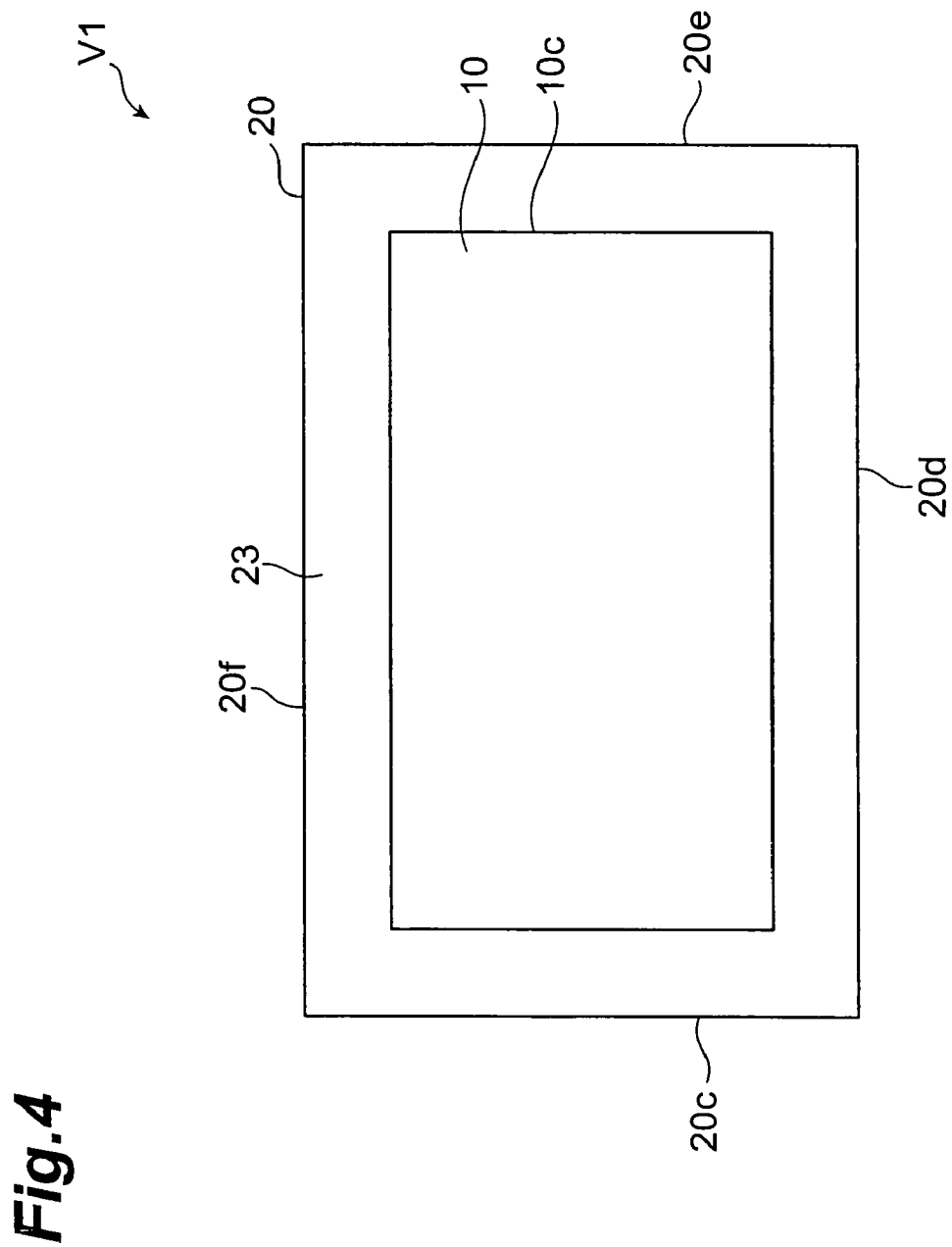
FIG. 4 is a schematic view showing a cross-sectional structure taken along the line IV-IV of FIG. 1.

With reference to FIGS. 1 to 4, the structure of a varistor V1 in accordance with an embodiment will be explained. FIG. 1 is a schematic front view showing the varistor in accordance with this embodiment. FIG. 2 is a schematic plan view showing the varistor in accordance with this embodiment. FIG. 3 is a schematic view showing a cross-sectional structure taken along the line III-III of FIG. 2. FIG. 4 is a schematic view showing a cross-sectional structure taken along the line IV-IV of FIG. 1.

The varistor V1 comprises a metal conductor 10 having a substantially rectangular parallelepiped form, an element body 20 covering the surfaces of the metal conductor 10 while having a substantially rectangular parallelepiped form, and a first external electrode 30 and a second external electrode 40 which are arranged on an outer surface 20a of the element body 20 (first face of the element body). The varistor V1 has its outer shape formed by the element body 20, whereas the outer surface 20a has a length and a width each in the order of 0.3 mm to 3.0 mm and a thickness in the order of 0.1 to 0.5 mm. Setting the thickness of the element body 20 as such can keep the strength of the varistor V1.

The metal conductor 10 is arranged within the element body 20. In the metal conductor 10, a first surface 10a, a second surface 10b, and third surfaces 10c constitute six surfaces of a rectangular parallelepiped form. The first surface 10a and second surface 10b oppose each other. The third surfaces 10c are four surfaces extending so as to connect the first and second surfaces 10a, 10b to each other. Namely, the third surfaces 10c are four surfaces which are each perpendicular to the first and second surfaces 10a, 10b and are adjacent to each other. The first to third surfaces 10a to 10c of the metal conductor 10 are covered with the element body 20. The metal conductor 10 has a thermal conductivity higher than that of the element body 20. The metal conductor 10 is formed by Ag, Cu, Ni, or Ag—Pd alloys, for example.

The element body 20 has the outer surface 20a, an outer surface 20b opposing the outer surface 20a, and outer surfaces 20c to 20f which are perpendicular to the outer surfaces 20a and 20b and adjacent to each other, thereby constructing a hexahedron. The outer surfaces 20c, 20e oppose each other, whereas the outer surfaces 20d, 20f oppose each other. The outer surfaces 20c, 20e are perpendicular and adjacent to the outer surfaces 20d, 20f. The element body 20 includes a first element body portion 21, a second element body portion 23, and a third element body portion 25.

The first element body portion 21 is a portion formed so as to be in contact with the whole first surface 10a of the metal conductor 10. The first element body portion 21 has the outer surface 20a and an inner face 21a (second surface of the element body) opposing the outer surface 20a while being in contact with the metal conductor 10.

The second element body portion 23 is a portion formed so as to be continuous with the first element body portion 21 and in contact with all the third surfaces 10c of the metal conductor 10. The second element body portion 23 has the outer surfaces 20c to 20f. Since the second element body portion 23 holds the metal conductor 10 in cooperation with the first element body portion 21, the first surface 10a of the metal conductor 10 and the inner face 21a of the element body 20 can be prevented from peeling off from each other.

The third element body portion 25 is a portion formed so as to be continuous with the second element body portion 23 and in contact with the whole second surface 10b of the metal conductor 10. The third element body portion 25 has the outer surface 20b. Since the third element body portion 25 holds the metal conductor 10 in cooperation with the first element body portion 21 and second element body portion 23, the first surface 10a of the metal conductor 10 and the inner face 21a of the element body 20 can be prevented from peeling off from each other.

The first element body portion 21, second element body portion 23, and third element body portion 25 are constructed as an element body 20 in which a plurality of varistor layers are laminated. The actual varistor V1 is integrated to such an extent that no boundaries are discernible between the plurality of varistor layers.

The varistor layers are made of a material exhibiting a nonlinear current-voltage characteristic. For example, the varistor layers are mainly composed of ZnO and contain elemental metals such as Pr or Bi or their oxides as accessory components. The content of ZnO in the varistor layers is not limited in particular but typically in the order of 99.8 to 69.0 mass %, where the total of the material constituting the varistor layers is 100 mass %.

In a manufacturing step, a portion corresponding to the metal conductor 10 and a multilayer body corresponding to the element body 20 formed so as to cover the outer surfaces of the portion corresponding to the metal conductor 10 are fired simultaneously. Therefore, the element body 20 can reliably hold the metal conductor 10.

On the outer surface 20a of the first element body portion 21 (element body 20), the first external electrode 30 and second external electrode 40 are formed so as to oppose the metal conductor 10. The first external electrode 30 and second external electrode 40 are arranged with a gap therebetween while each having a rectangular form when seen in a direction perpendicular to the outer surface 20a. The first external electrode 30 extends to an edge of the outer surface 20a so as to be exposed at the outer surfaces 20f, 20c, 20d of the element body 20. The second external electrode 40 extends to an edge of the outer surface 20a so as to be exposed at the outer surfaces 20f, 20e, 20d of the element body 20.

The first external electrode 30 and second external electrode 40 function as I/O terminals of the varistor V1. The first external electrode 30 and second external electrode 40 can be formed by printing or plating, for example. When the printing is used, a conductive paste in which an organic binder or organic solvent is mixed with a metal powder mainly composed of Au or Pt particles is prepared, printed on the element body 20, and baked or fired. When the plating is used, Au or Pt is deposited by vacuum plating (vacuum deposition, sputtering, ion plating, or the like), so as to form the first external electrode 30 and second external electrode 40.

The first external electrode 30 has a region overlapping the metal conductor 10 when seen in a direction perpendicular to the outer surface 20a. Namely, the first element body portion 21 has a region 27 overlapping the metal conductor 10 and first external electrode 30 when seen in a direction perpendicular to the outer surface 20a. The second external electrode 40 has a region overlapping the metal conductor 10 when seen in a direction perpendicular to the outer surface 20a. Namely, the first element body portion 21 has a region 29 overlapping the metal conductor 10 and second external electrode 40 when seen in a direction perpendicular to the outer surface 20a. The regions 27, 29 are included in the first element body portion 21. The regions 27, 29 function as areas exhibiting a nonlinear current-voltage characteristic.

In the varistor V1, the regions 27, 29 are connected in series through the metal conductor 10. Namely, they function as two varistor components connected in series between the first external electrode 30 and second external electrode 40. Therefore, even when one of the regions 27, 29 falls into a short-circuited state, the other region exhibits a nonlinear current-voltage characteristic. This can prevent the function as a varistor component from being lost.

In this embodiment, the metal conductor 10 has a thermal conductivity higher than that of the element body 20, whereby the heat transmitted to the varistor V1 can efficiently be diffused from the metal conductor 10. The heat transmitted to the varistor V1 can be transmitted to other members as well.

Since the second element body portion 23 is formed so as to be continuous with the first element body portion 21 and in contact with the third surfaces 10c of the metal conductor 10, the first element body portion 21 and second element body portion 23 can hold the metal conductor 10 in this embodiment. This can prevent the first surface 10a of the metal conductor 10 and the inner face 21a of the first element body portion 21 from peeling off from each other.

Since the third element body portion 25 is formed so as to be continuous with the second element body portion 25 and in contact with the second surface 10b of the metal conductor 10, the first element body portion 21, second element body portion 23, and third element body portion 25 can hold the metal conductor 10. This can prevent the first surface 10a of the metal conductor 10 and the inner face 21a of the first element body portion 21 from peeling off from each other.

A more preferred example of the relationship between the metal conductor 10 and element body 20 will now be explained. FIG. 3 shows a cross section of the varistor V1 which passes the metal conductor 10 while being parallel to the outer surface 20d. Preferably, the thickness A of the first element body portion 21 is at least 10 µm but not more than 200 µm. The thickness A is the thickness between the first external electrode 30 and second external electrode 40 and the metal conductor 10.

When the thickness A is at least 10 µm, the strength of the first element body portion 21 can be secured. When the thickness A is not more than 200 µm, the distance from the first and second external electrodes 30, 40 to the metal conductor 10 can be shortened, so as to improve the thermal conduction rate therebetween. This can diffuse heat more efficiently from the metal conductor 10, and dissipate heat efficiently from the varistor V1.

Preferably, the thickness B of the metal conductor 10 is at least the thickness A of the first element body portion 21. The thickness B of the metal conductor 10 is the thickness thereof in a direction in which the metal conductor 10 opposes the first and second external electrodes 30, 40. Namely, the thickness B of the metal conductor 10 is the shortest distance between the first surface 10a and second surface 10b. When the thickness B is at least the thickness A, the effect of dissipating heat from the metal conductor 10 can be improved more.

FIG. 4 shows a cross section of the varistor V1 which passes the metal conductor 10 while being perpendicular to the opposing direction of the metal conductor 10 and the first and second external electrodes 30, 40. In the cross section passing the metal conductor 10 while being perpendicular to the opposing direction of the metal conductor 10 and the first and second external electrodes 30, 40, the area ratio S of the metal conductor 10 is preferably at least 20% but not more than 99.7%, where the total area of the metal conductor 10 and the element body 20 (second element body portion 23) is 100%.

When the area ratio S is at least 20%, the effect of dissipating heat from the metal conductor 10 becomes greater for the heat insulating effect of the element body 20, whereby heat can be dissipated more efficiently from the metal conductor 10. This can improve the heat dissipating effect of the varistor V1. When the area ratio S is not more than 99.7%, the element body 20 can hold the metal conductor 10, thereby preventing the first surface 10a of the metal conductor 10 and the inner face 21a of the first element body portion 21 from peeling off from each other. Preferably, the thickness of the second element body portion 23 is at least 5 µm.

Preferably, the volume ratio V of the metal conductor 10 is at least 10% but not more than 99.7%, where the total volume of the metal conductor 10 and element body 20 is 100%. When the volume ratio V is at least 10%, the effect of dissipating heat from the metal conductor 10 becomes greater for the heat insulating effect of the element body 20, whereby heat can be dissipated more efficiently from the metal conductor 10. This can improve the heat dissipating effect of the varistor V1. When the volume ratio V is not more than 99.7%, the element body 20 can hold the metal conductor 10, thereby preventing the first surface 10a of the metal conductor 10 and the inner face 21a of the first element body portion 21 from peeling off from each other.

Figure 5:
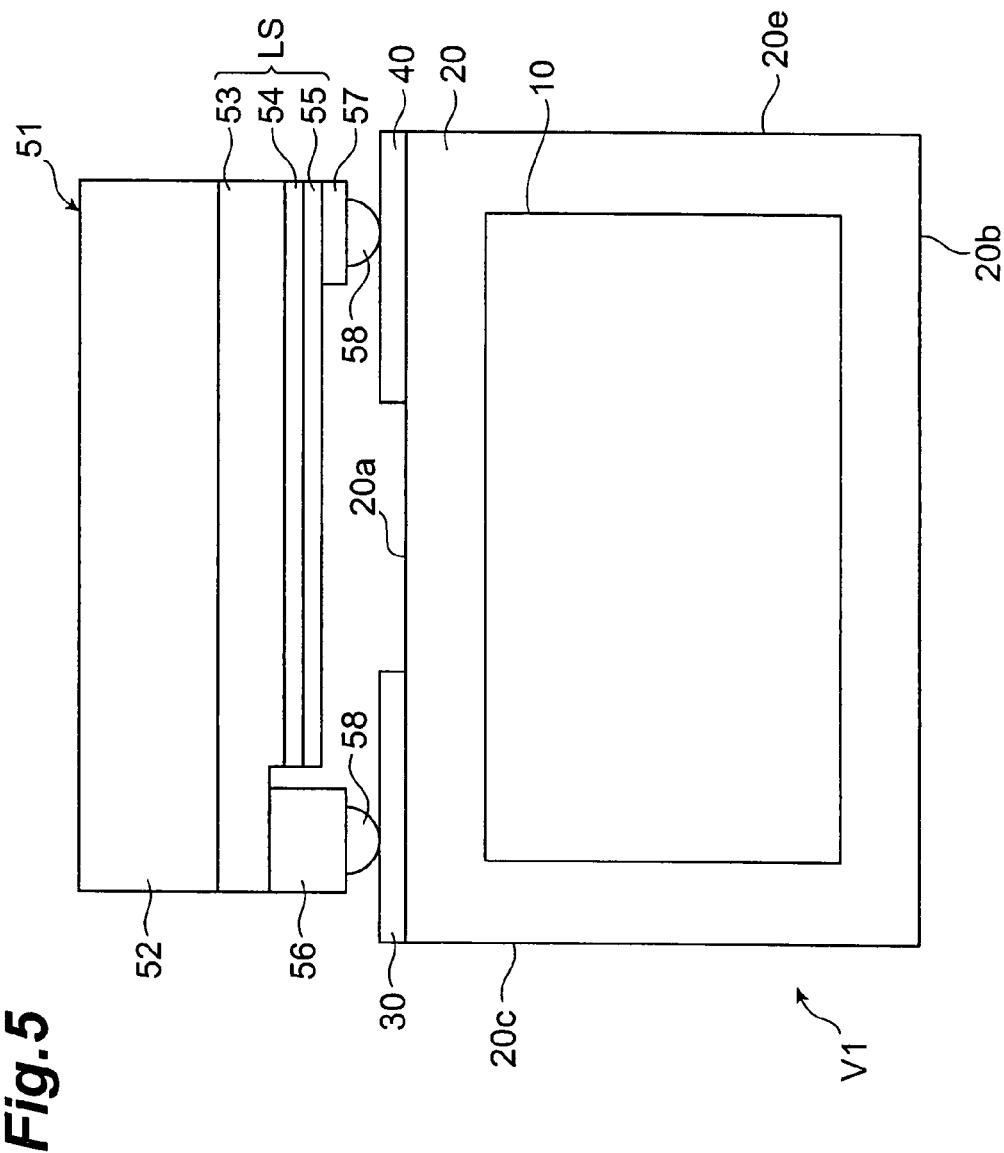
FIG. 5 is a schematic view showing a cross-sectional structure of the light-emitting apparatus in accordance with an embodiment.

With reference to FIG. 5, the structure of a light-emitting apparatus LE in accordance with an embodiment will now be explained. FIG. 5 is a schematic view for explaining a cross-sectional structure of the light-emitting apparatus in accordance with this embodiment. FIG. 5 shows a cross-sectional structure of the light-emitting apparatus LE taken along a plane including the metal conductor 10.

The light-emitting apparatus LE comprises the varistor V1 having the structure mentioned above and a semiconductor light-emitting device 51 connected electrically to the varistor V1.

The semiconductor light-emitting device 51 is a light-emitting diode (LED) made of a semiconductor based on GaN (gallium nitride) comprising a substrate 52 and a layer structure LS formed on the substrate 52. The GaN-based semiconductor LED has been known well, and thus will be explained only in brief. The substrate 52 is an optically transparent, electrically insulating substrate made of sapphire. The layer structure LS includes an n-type (first conductivity type) semiconductor region 53, a light-emitting layer 54, and a p-type (second conductivity type) semiconductor region 55 which are laminated. The semiconductor light-emitting device 51 emits light according to a voltage applied between the n-type semiconductor region 53 and the p-type semiconductor region 55.

The n-type semiconductor region 53 contains an n-type nitride semiconductor. In this embodiment, the n-type semiconductor region 53 is formed by epitaxially growing GaN on the substrate 52 and is doped with an n-type dopant such as Si, for example, so as to exhibit n-type conductivity. The n-type semiconductor region 53 may have such a composition as to yield a smaller refractive index and greater bandgap as compared with the light-emitting layer 54. In this case, the n-type semiconductor region 53 acts as a lower cladding for the light-emitting layer 54.

The light-emitting layer 54 is formed on the n-type semiconductor region 53, and emits light in its light-emitting region when carriers (electron and hole) supplied from the n-type semiconductor region 53 and p-type semiconductor region 55 are recombined. The light-emitting layer 54 may have a multiple quantum well (MQW) structure in which barrier and well layers are alternately laminated over a plurality of periods, for example. In this case, the barrier and well layers are made of InGaN, while their In (indium) compositions are appropriately selected such that the barrier layers have a bandgap greater than that of the well layers. The light-emitting region is generated in an area where the carriers are injected in the light-emitting layer 54.

The p-type semiconductor region 55 contains a p-type nitride semiconductor. In this embodiment, the p-type semiconductor region 55 is formed by epitaxially growing AlGaN on the light-emitting layer 54 and is doped with a p-type dopant such as Mg, for example, so as to exhibit p-type conductivity. The p-type semiconductor region 55 may have such a composition as to yield a smaller refractive index and greater bandgap as compared with the light-emitting layer 54. In this case, the p-type semiconductor region 55 acts as an upper cladding for the light-emitting layer 54.

A cathode electrode 56 is formed on the n-type semiconductor region 53. The cathode electrode 56 is made of a conductive material, and realizes an ohmic contact with the n-type semiconductor region 53. An anode electrode 57 is formed on the p-type semiconductor region 55. The anode electrode 57 is made of a conductive material, and realizes an ohmic contact with the p-type semiconductor region 55. The cathode electrode 56 and anode electrode 57 are formed with bump electrodes 58.

When a predetermined voltage is applied between the anode electrode 57 (bump electrode 58) and cathode electrode 56 (bump electrode 58), so as to cause a current to flow, light is emitted in the light-emitting region of the light-emitting layer 54 in the semiconductor light-emitting device 51 having the structure mentioned above.

The semiconductor light-emitting device 51 is bump-connected to the first external electrode 30 and second external electrode 40. Namely, the cathode electrode 56 is connected electrically and physically to the first external electrode 30 through the bump electrode 58. The anode electrode 57 is connected electrically and physically to the second external electrode 40 through the bump electrode 58. Consequently, the varistor V1 is connected in parallel to the semiconductor light-emitting device 51. Therefore, the varistor V1 can protect the semiconductor light-emitting device 51 against ESD surges.

In the light-emitting apparatus LE, the bump electrodes 58 of the semiconductor light-emitting device 51 are physically connected to the first external electrode 30 and second external electrode 40 of the varistor V1, respectively, and thus are thermally connected thereto. Therefore, the heat generated in the semiconductor light-emitting device 51 is transmitted to the varistor V1 through the bump electrodes 58 and first and second electrodes 30, 40. Since the metal conductor 10 having a high thermal conductivity is arranged on the inner face 21a opposing the outer surface 20a of the element body 20 on which the first external electrode 30 and second external electrode 40 are placed in the varistor V1, the heat transmitted to the varistor V1 can efficiently be diffused from the metal conductor 10. The heat transmitted to the varistor V1 can also be transferred to other members.

Since the thickness A of the first element body portion 21 is 200 μm or less, the varistor V1 can shorten the distance from the first and second external electrodes 30, 40 to the metal conductor 10, thereby further improving the thermal conduction rate therebetween. Namely, the heat generated in the semiconductor light-emitting device 51 is transmitted more efficiently to the metal conductor 10 through the first and second external electrodes 30, 40, and thus is efficiently diffused from the metal conductor 10. Therefore, heat can be dissipated efficiently from the varistor V1.

Since the thickness B of the metal conductor 10 is at least the thickness A of the first element body portion 21, the varistor V1 can further improve the thermal conduction rate between the first and second external electrodes 30, 40 and metal conductor 10. Namely, the heat generated in the semiconductor light-emitting device 51 is transmitted more efficiently to the metal conductor 10 through the first and second external electrodes 30, 40, and thus is efficiently diffused from the metal conductor 10. Therefore, heat can be dissipated efficiently from the varistor V1.

Though preferred embodiments of the present invention are explained in the foregoing, the present invention is not necessarily limited to the above-mentioned embodiments, but can be modified in various ways within scopes not deviating from the gist thereof.

Though the second element body portion 23 and third element body portion 25 are made of a material exhibiting a nonlinear current-voltage characteristic in the above-mentioned embodiments, this is not restrictive. The second element body portion 23 and third element body portion 25 may be formed from an electrically insulating material. This can prevent short circuits from occurring in the varistor V1. In this case, a mixture mainly composed of glass containing ZnO, $Al_2O_3$, $SiO_2$, $CaCO_3$, or $TiO_2$ can be used as the electrically insulating material.

Though the first element body portion 21 as a whole is formed from a material exhibiting a nonlinear current-voltage characteristic in the above-mentioned embodiments, it will be sufficient if at least the region between the first external electrode 30 and second external electrode 40 and the metal conductor 10 in the first element body portion 21 is formed from a material exhibiting a nonlinear current-voltage characteristic.

Though the second element body portion 23 is formed in contact with all the third surfaces 10c of the metal conductor 10 in the embodiments, this is not restrictive. The second element body portion 23 may be formed in contact with a portion of the third surfaces 10c of the metal conductor 10. In this case, a portion of the third surfaces 10c of the metal conductor 10 is exposed from the element body 20, whereby the efficiency of dissipating heat from the metal conductor 10 becomes higher.

Though the third element body portion 25 is formed in contact with the whole second surface 10b of the metal conductor 10 in the embodiments, this is not restrictive. The third element body portion 25 may be formed in contact with a portion of the second surface 10b of the metal conductor 10. In this case, a portion of the second surface 10b of the metal conductor 10 is exposed from the element body 20, whereby the efficiency of dissipating heat from the metal conductor 10 becomes higher.

Though the element body 20 of the varistor V1 includes the second element body portion 23 and third element body portion 25 in the embodiments, this is not restrictive. By way of example, varistors V2 to V4 in accordance with first to third modified examples will be explained.

First Modified Example

Figure 6:
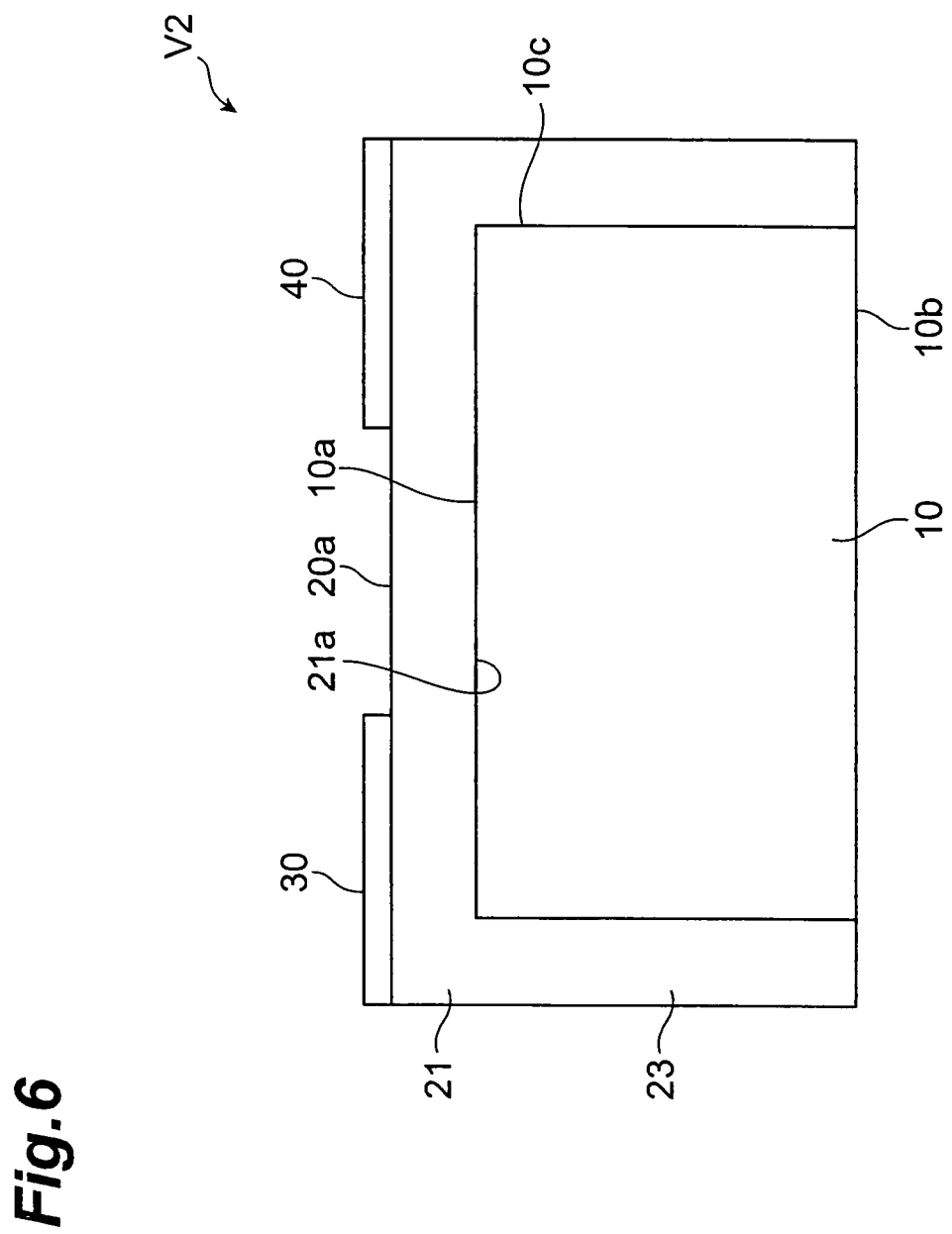
FIG. 6 is a schematic view showing a cross-sectional structure of the varistor in accordance with the first modified example of the embodiment.

With reference to FIG. 6, the varistor V2 in accordance with the first modified example will be explained. FIG. 6 is a schematic view showing a cross-sectional structure of the varistor in accordance with the first modified example of the embodiment. The varistor V2 in accordance with the first modified example and the varistor V1 in accordance with the above-mentioned embodiment differ from each other in that the varistor V2 does not include the third element body portion 25.

Namely, the second surface 10b of the metal conductor 10 is exposed from the element body. Therefore, heat can be diffused more efficiently from the metal conductor 10 and thus from the varistor V2.

Second Modified Example

Figure 7:
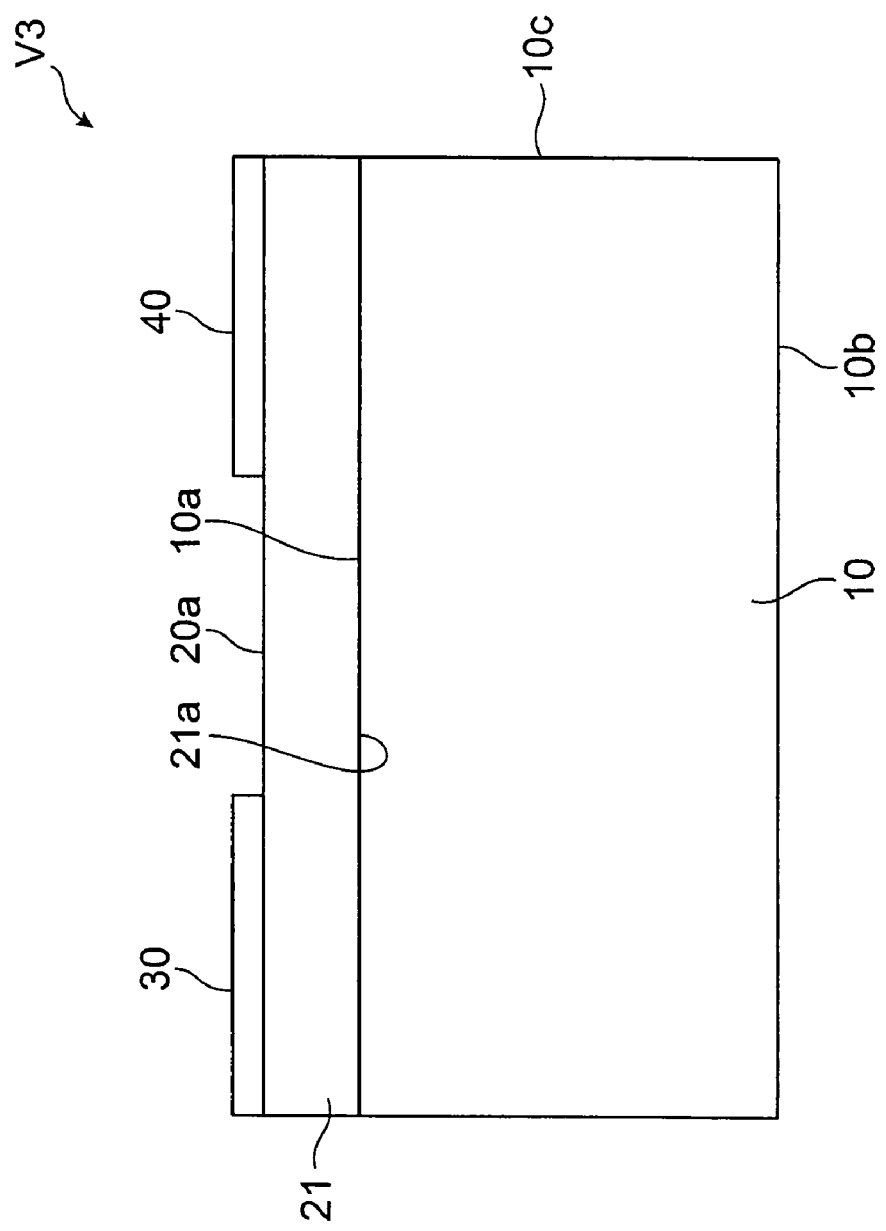
FIG. 7 is a schematic view showing a cross-sectional structure of the varistor in accordance with the second modified example of the embodiment.

With reference to FIG. 7, the varistor V3 in accordance with the second modified example will be explained. FIG. 7 is a schematic view showing a cross-sectional structure of the varistor in accordance with the second modified example of the embodiment. The varistor V2 in accordance with the second modified example and the varistor V1 in accordance with the above-mentioned embodiment mainly differ from each other in that the varistor V3 includes none of the second element body portion 23 and third element body portion 25.

The element body of the varistor V3 comprises the first element body portion 21. The inner face 21a of the first element body portion 21 and the first surface 10a of the metal conductor 10 have the same form and are in contact with each other. The second surface 10b and third surfaces 10c of the metal conductor 10 are exposed from the element body. Therefore, heat can be diffused more efficiently from the metal conductor 10 and thus from the varistor V3.

The element body of the varistor may comprise the first element body portion 21 and third element body portion 25 without the second element body portion 23.

Third Modified Example

Figure 8:
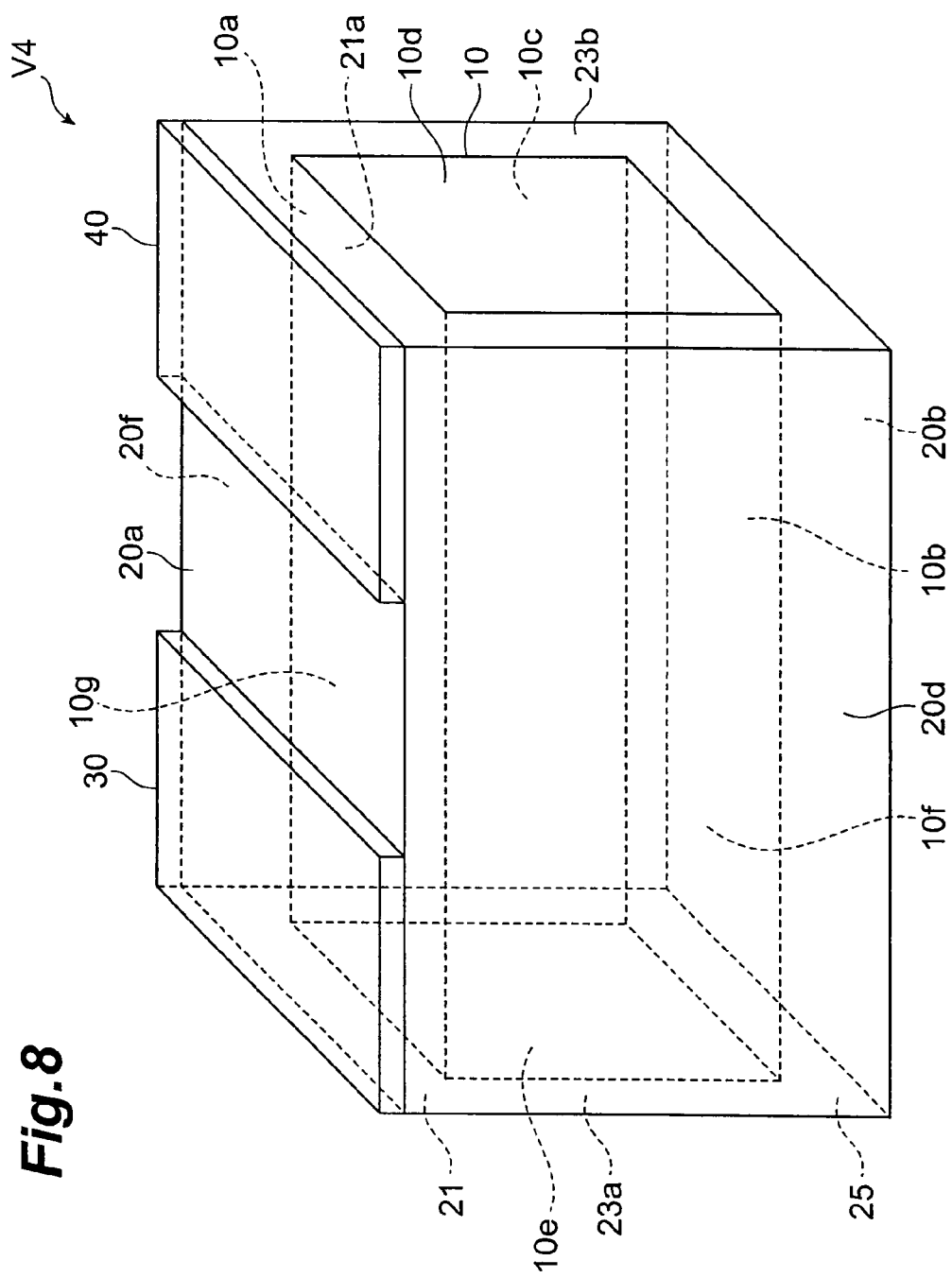
FIG. 8 is a schematic perspective view showing the varistor in accordance with the third modified example of the embodiment.

With reference to FIG. 8, the varistor V4 in accordance with the third modified example will be explained. FIG. 8 is a schematic perspective view showing the varistor in accordance with the third modified example of the embodiment. The varistor V4 in accordance with the third modified example and the varistor V1 in accordance with the above-mentioned embodiment mainly differ from each other in terms of the element body structure.

The element body in the varistor V4 has a first element body portion 21, second element body portions 23a, 23b, and a third element body portion 25. The second element body portions 23a, 23b respectively cover two faces 10f, 10g opposing each other among the four faces constituting the third surfaces 10c of the metal conductor 10.

The second element body portion 23a has surfaces opposing each other. One of the opposing surfaces is formed in contact with the face 10f of the metal conductor 10, whereas the other constitutes the outer surface 20d of the element body. The second element body portion 23a is continuous with the first element body portion 21 and third element body portion 25.

The second element body portion 23b has surfaces opposing each other. One of the opposing surfaces is formed in contact with the face 10g of the metal conductor 10, whereas the other constitutes the outer surface 20f of the element body. The second element body portion 23b is continuous with the first element body portion 21 and third element body portion 25.

In the varistor V4 in accordance with the third modified example, faces 10d, 10e constituting the third surfaces 10c of the metal conductor 10 and opposing each other while being perpendicular to the faces 10f, 10g are exposed from the element body. Therefore, heat can be diffused more efficiently from the metal conductor 10 and thus from the varistor V4. The second element body portions 23a, 23b are continuous with the first element body portion 21 and third element body portion 25, respectively, and thus can hold the metal conductor 10, thereby preventing the first surface 10a of the metal conductor 10 and the inner face 21a of the first element body portion 21 from peeling off from each other.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A varistor comprising:
    an element body including a first portion having first and second faces opposing each other;
    two external electrodes arranged on the first face of the element body; and
    a metal conductor, arranged on the second face of the element body, the metal conductor having a thermal conductivity higher than that of the element body and being separate from the two external electrodes;
    wherein at least a region between the two external electrodes and the metal conductor in the element body exhibits a nonlinear current-voltage characteristic.

2. A varistor according to claim 1,
    wherein the metal conductor has a first surface in contact with the second face of the element body, a second surface opposing the first surface, and a third surface extending to connect the first and second surfaces to each other; and wherein the element body further comprises a second portion that is continuous with the first portion having the first and second faces of the element body and is in contact with the third surface of the metal conductor.

3. A varistor according to claim 2,
wherein the element body further comprises a third portion that is continuous with the second portion formed in contact with the third surface of the metal conductor and is in contact with the second surface of the metal conductor.

4. A varistor according to claim 2,
wherein, in a cross section, perpendicular to an opposing direction of the metal conductor and the two external electrodes, passing the metal conductor, the metal conductor has an area ratio of at least 20% but not more than 99.7%, where a total area of the metal conductor and element body is 100%.

5. A varistor according to claim 1,
wherein a thickness between the two external electrodes and the metal conductor in the element body is at least 10 µm but not more than 200 µm.

6. A varistor according to claim 1,
wherein a thickness of the metal conductor in the opposing direction of the metal conductor and the two external electrodes is at least a thickness between the two external electrodes and the metal conductor in the element body.

7. A varistor according to claim 1,
wherein the metal conductor has a volume ratio of at least 10% but not more than 99.7%, where a total volume of the element body and metal conductor is 100%.

8. A varistor comprising:
an element body;
a metal conductor, arranged within the element body, the metal conductor having a thermal conductivity higher than that of the element body; and
two external electrodes arranged on an outer surface of the element body to oppose the metal conductor;
wherein at least a region between the two external electrodes and the metal conductor in the element body exhibits a nonlinear current-voltage characteristic, and
the metal conductor is separate from the two external electrodes.

9. A varistor according to claim 8,
wherein, in a cross section, perpendicular to an opposing direction of the metal conductor and the two external electrodes, passing the metal conductor, the metal conductor has an area ratio of at least 20% but not more than 99.7%, where a total area of the metal conductor and element body is 100%.

10. A varistor according to claim 8,
wherein a thickness between the two external electrodes and the metal conductor in the element body is at least 10 µm but not more than 200 µm.

11. A varistor according to claim 8,
wherein a thickness of the metal conductor in the opposing direction of the metal conductor and the two external electrodes is at least a thickness between the two external electrodes and the metal conductor in the element body.

12. A varistor according to claim 8,
wherein the metal conductor has a volume ratio of at least 10% but not more than 99.7%, where a total volume of the element body and the metal conductor is 100%.

13. A light-emitting apparatus comprising:
the varistor according to claim 1; and
a semiconductor light-emitting device connected physically and electrically to the two external electrodes so as to be connected in parallel to the varistor.

14. A light-emitting apparatus comprising:
the varistor according to claim 8; and
a semiconductor light-emitting device connected physically and electrically to the two external electrodes so as to be connected in parallel to the varistor.

* * * * *